(12) United States Patent
Long

(10) Patent No.: US 11,374,031 B2
(45) Date of Patent: Jun. 28, 2022

(54) ELECTROSTATIC PROTECTION CIRCUIT AND MANUFACTURING METHOD THEREOF, ARRAY SUBSTRATE AND DISPLAY APPARATUS

(71) Applicant: BOE Technology Group Co., Ltd., Beijing (CN)

(72) Inventor: Chunping Long, Beijing (CN)

(73) Assignee: BOE Technology Group Co., LTD., Beijing (CN)

( * ) Notice: Subject to any disclaimer, the term of this patent is extended or adjusted under 35 U.S.C. 154(b) by 168 days.

(21) Appl. No.: 16/633,184

(22) PCT Filed: Jun. 26, 2019

(86) PCT No.: PCT/CN2019/093069
§ 371 (c)(1),
(2) Date: Jan. 23, 2020

(87) PCT Pub. No.: WO2020/024734
PCT Pub. Date: Feb. 6, 2020

(65) Prior Publication Data
US 2021/0082963 A1  Mar. 18, 2021

(30) Foreign Application Priority Data
Aug. 3, 2018  (CN) .......................... 201821253155.6

(51) Int. Cl.
*H01L 27/12* (2006.01)
*H01L 27/02* (2006.01)
*G09G 3/20* (2006.01)

(52) U.S. Cl.
CPC ............ *H01L 27/124* (2013.01); *G09G 3/20* (2013.01); *H01L 27/0248* (2013.01);
(Continued)

(58) Field of Classification Search
CPC ............... H01L 27/124; H01L 27/0248; H01L 27/1218; H01L 27/0266; G09G 2310/0275; G09G 2330/04
(Continued)

(56) References Cited

U.S. PATENT DOCUMENTS 10,269,788 B2 * 4/2019 Cheng ................. H01L 27/0296
2015/0263516 A1 * 9/2015 Zhao ...................... H02H 9/044
361/91.5
(Continued)

FOREIGN PATENT DOCUMENTS

| CN | 202332851 | * | 7/2012 | ............. H01L 27/02 |
| CN | 202332851 U | | 7/2012 | |
| CN | 208368505 U | | 1/2019 | |

OTHER PUBLICATIONS

International Search Report from PCT/CN2019/093069 dated Sep. 10, 2019.

*Primary Examiner* — David Vu
*Assistant Examiner* — Brandon C Fox
(74) *Attorney, Agent, or Firm* — Fay Sharpe LLP

(57) ABSTRACT

An electrostatic protection circuit and a manufacturing method thereof, an array substrate and a display apparatus in the field of display technology are provided. This electrostatic protection circuit includes: a discharge sub-circuit, a buffer sub-circuit and an electrostatic protection line, wherein the electrostatic protection line is a common electrode line; the buffer sub-circuit includes a third transistor and a fourth transistor; a gate and a second electrode of the third transistor are both connected to a first electrode of the fourth transistor, and the first electrode of the third transistor is connected to a signal line; a gate and a second electrode of the fourth transistor are both connected to the signal line.

18 Claims, 12 Drawing Sheets

(52) U.S. Cl.
CPC ...... *H01L 27/1218* (2013.01); *H01L 27/1262* (2013.01); *G09G 2310/0275* (2013.01); *G09G 2330/04* (2013.01)

(58) Field of Classification Search
USPC .................................................. 257/173, 355
See application file for complete search history.

(56) References Cited

U.S. PATENT DOCUMENTS

| | | | |
|---|---|---|---|
| 2017/0110478 A1* | 4/2017 | Gai | H01L 27/0266 |
| 2020/0349877 A1* | 11/2020 | Xiao | G09G 3/20 |
| 2021/0088856 A1* | 3/2021 | Li | G02F 1/1368 |

\* cited by examiner

ELECTROSTATIC PROTECTION CIRCUIT AND MANUFACTURING METHOD THEREOF, ARRAY SUBSTRATE AND DISPLAY APPARATUS

The present disclosure is a 371 of PCT Patent Application No. PCT/CN2019/093069 filed on Jun. 26, 2019, which claims priority to Chinese Patent Application No. 201821253155.6, filed on Aug. 3, 2018 and entitled "ELECTROSTATIC PROTECTION CIRCUIT, ARRAY SUBSTRATE AND DISPLAY APPARATUS", the entire contents of which are incorporated herein by reference.

TECHNICAL FIELD

The present disclosure relates to the field of display technologies, and in particular, to an electrostatic protection circuit and a manufacturing method thereof, an array substrate, and a display apparatus.

BACKGROUND

During the manufacturing process of an array substrate, the processes such as plasma deposition, film layer etching and friction and the like easily generate static electricity. Therefore, signal lines formed on the array substrate may undergo electrostatic breakdown and electrostatic damage, resulting in defective array substrates. In order to ensure the normal operation of various signal lines, an electrostatic protection device connected to the signal lines is provided on the array substrate. This electrostatic protection device is also generally referred to as an Electro-Static Discharge (ESD) device.

The electrostatic protection device in the related art generally includes a transistor and an electrostatic protection line. The source of the transistor may be connected to the signal line, and the gate and the drain of the transistor may both be connected to the electrostatic protection line. The transistor may release the static electricity generated on the signal line to the electrostatic protection line in time.

SUMMARY

The present disclosure provides an electrostatic protection circuit and a manufacturing method thereof, an array substrate, and a display apparatus. The technical solutions are as follows.

In an aspect, an electrostatic protection circuit is provided. The electrostatic protection circuit comprises: at least one discharge sub-circuit, at least one buffer sub-circuit and an electrostatic protection line; the electrostatic protection line being a common electrode line; each of the at least one discharge sub-circuit comprising a first transistor and a second transistor, and each of the at least one buffer sub-circuit comprising a third transistor and a fourth transistor;

wherein a gate and a second electrode of the first transistor are connected to a signal line, and a first electrode of the first transistor is connected to the electrostatic protection line;

a gate and a second electrode of the second transistor are connected to the electrostatic protection line, and a first electrode of the second transistor is connected to the signal line;

a gate and a second electrode of the third transistor are connected to a first electrode of the fourth transistor, and a first electrode of the third transistor is connected to the signal line; and a gate and a second electrode of the fourth transistor are connected to the signal line.

Optionally, the electrostatic protection comprises: two buffer sub-circuits.

Optionally, the signal line comprises: a first line segment and a second line segment that are parallel to each other, and a connection line segment for connecting the first line segment and the second line segment;

the third transistor and the fourth transistor are both disposed between the first line segment and the second line segment, and the first electrode of the third transistor is connected to one of the first line segment and the second line segment, and the gate and the second electrode of the fourth transistor are both connected to the other of the first line segment and the second line segment.

Optionally, the first line segment and the second line segment are both parallel to the electrostatic protection line, and the second line segment is close to the electrostatic protection line relative to the first line segment;

the first transistor and the second transistor are both disposed between the second line segment and the electrostatic protection line, and the gate and the second electrode of the first transistor and the first electrode of the second transistor are all connected to the second line segment.

Optionally, the first line segment and the second line segment are disposed in the same layer, and the first line segment and the connection line segment are disposed in different layers;

the connection line segment is connected to the first line segment and the second line segment through vias, respectively.

Optionally, the signal line is a gate line, and the first line segment and the second line segment are both disposed in the same layer as the gates of the transistors, and the connection line segment is disposed in the same layer as the first electrodes and the second electrodes of the transistors.

Optionally, the signal line is a data line, and the first line segment and the second line segment are both disposed in the same layer as the first electrodes and the second electrodes of the transistors, and the connection line segment is disposed in the same layer as the gates of the transistors.

Optionally, the electrostatic protection circuit further comprises: a metal wire insulated from both the signal line and the electrostatic protection line;

wherein the gate and the second electrode of the third transistor, and the first electrode of the fourth transistor are connected to the metal wire.

Optionally, the metal wire is disposed between the first line segment and the second line segment, and the metal wire is parallel to the first line segment.

Optionally, the gate of the third transistor and the metal wire are of an integral structure.

Optionally, the electrostatic protection circuit is applied in an array substrate;

the metal wire is not connected to other signal lines in the array substrate, and is not connected to a signal terminal.

Optionally, wherein the second electrode of the third transistor and the first electrode of the fourth transistor are of an integral structure.

Optionally, the second electrode of the first transistor and the first electrode of the second transistor are of an integral structure, and the first electrode of the first transistor and the second electrode of the second transistor are of an integral structure.

In another aspect, an array substrate is provided. The array substrate comprises:

a signal line, and the electrostatic protection circuit, connected to the signal line, described in the above aspect.

Optionally, the signal line comprises: a first line segment and a second line segment that are parallel to each other, and a connection line segment for connecting the first line segment and the second line segment;

a third transistor and a fourth transistor in the electrostatic protection circuit are disposed between the first line segment and the second line segment, and a first electrode of the third transistor is connected to one of the first line segment and the second line segment, and a gate and a second electrode of the fourth transistor are both connected to the other of the first line segment and the second line segment.

Optionally, the first line segment and the second line segment are both parallel to an electrostatic protection line in the electrostatic protection circuit, and the second line segment is close to the electrostatic protection line relative to the first line segment;

a first transistor and a second transistor are both disposed between the second line segment and the electrostatic protection line, and a gate and a second electrode of the first transistor, and a first electrode of the second transistor are all connected to the second line segment.

In still yet another aspect, a display apparatus is provided. The display apparatus comprises: the array substrate described in the above aspect.

In still yet another aspect, a method for manufacturing an electrostatic protection circuit is provided. The method comprises:

providing a base substrate;

forming at least one discharge sub-circuit, at least one buffer sub-circuit and an electrostatic protection line on the base substrate;

wherein the electrostatic protection line is a common electrode line, each of the at least one discharge sub-circuit comprises a first transistor and a second transistor, and each of the at least one buffer sub-circuit comprises a third transistor and a fourth transistor; wherein a gate and a second electrode of the first transistor are connected to the signal line, and a first electrode of the first transistor is connected to the electrostatic protection line; a gate and a second electrode of the second transistor are connected to the electrostatic protection line, and a first electrode of the second transistor is connected to the signal line; a gate and a second electrode of the third transistor are connected to a first electrode of the fourth transistor, and a first electrode of the third transistor is connected to the signal line; and a gate and a second electrode of the fourth transistor are connected to the signal line.

BRIEF DESCRIPTION OF THE DRAWINGS

In order to describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may also derive other drawings from these accompanying drawings without creative efforts.

DETAILED DESCRIPTION

The present disclosure will be described in further detail with reference to the accompanying drawings, to present the objects, technical solutions, and advantages of the present disclosure more clearly.

The transistors used in the embodiments of the present disclosure may all be thin film transistors. The transistors used in the embodiments of the present disclosure are mainly switching transistors according to their functions in the circuit. Since the source and the drain of the switching transistor used herein are symmetrical, the source and drain are interchangeable. In the embodiment of the present disclosure, the source may be referred to as a first electrode and the drain may be referred to as a second electrode; or the source may be referred to as a second electrode and the drain may be referred to as a first electrode. According to the formations in the accompanying drawings, it's specified that the intermediate terminal of the transistor is a gate, the signal input terminal is a source, and the signal output terminal is a drain.

Figure 1:
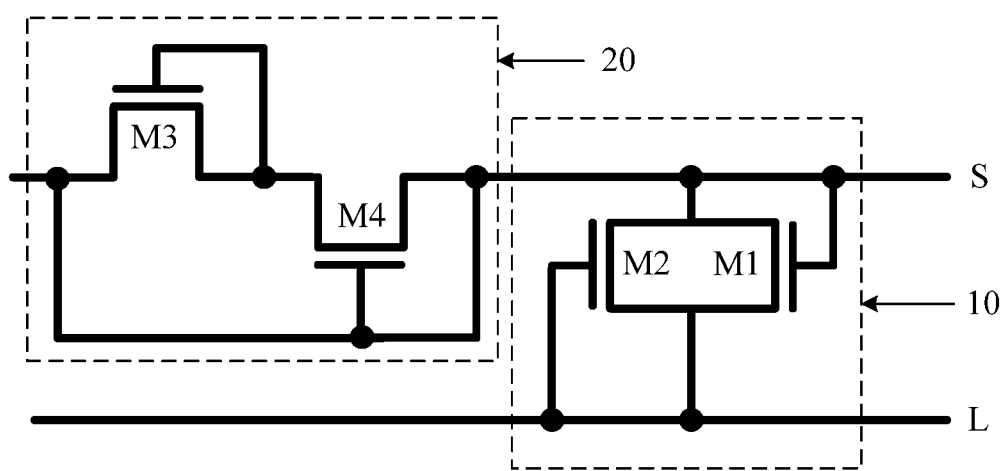
FIG. 1 is an equivalent circuit diagram of an electrostatic protection circuit provided in an embodiment of the present disclosure.

FIG. 1 is an equivalent circuit diagram of an electrostatic protection circuit provided in an embodiment of the present disclosure. Referring to FIG. 1, the electrostatic protection circuit may include at least one discharge sub-circuit 10, at least one buffer sub-circuit 20, and an electrostatic protection line L.

Each discharge sub-circuit 10 may include a first transistor M1 and a second transistor M2. Each buffer sub-circuit 20 includes a third transistor M3 and a fourth transistor M4.

The gate and the second electrode of the first transistor M1 are both connected to a signal line S, and the first electrode of the first transistor M1 is connected to the electrostatic protection line L.

The gate and the second electrode of the second transistor M2 are both connected to the electrostatic protection line L, and the first electrode of the second transistor M2 is connected to the signal line S.

The gate and the second electrode of the third transistor M3 are both connected to the first electrode of the fourth transistor M4, and the first electrode of the third transistor M3 is connected to the signal line S.

The gate and the second electrode of the fourth transistor M4 are both connected to the signal line S.

Illustratively, the electrostatic protection circuit shown in FIG. 1 includes one discharge sub-circuit 10 and one buffer sub-circuit 20.

The signal line S may be any signal line on the array substrate, for example, any signal line configured to drive a display apparatus, such as a data line, a gate line, or a clock signal line of a gate drive circuit. Alternatively, the signal line may also be a test line or a maintenance line in the array substrate. The electrostatic protection line L may be configured to provide a reference power signal. For example, the electrostatic protection line L may be a common electrode (Vcom) line that is configured to provide a common electrode signal with a potential of 0V or about 0V.

When static electricity is generated on the signal line S, the first transistor M1 or the second transistor M2 in the discharge sub-circuit 10 may be turned on, to conduct the signal line S with the electrostatic protection line L, so that the static electricity generated on signal line S may be released onto the electrostatic protection line L.

Meanwhile, the third transistor M3 or the fourth transistor M4 in the buffer sub-circuit 20 may be turned on. Before the static electricity generated on the signal line S is released to the electrostatic protection line L, the buffer sub-circuit 20 may form a temporary buffer channel for the static electricity, to temporarily store electrostatic charges, so as to avoid the impact of static electricity on the discharge sub-circuit 10. This prevents the transistors in the discharge sub-circuit 10 connected to the electrostatic protection line L from being burned out, and improves the reliability of the electrostatic protection circuit.

In summary, the embodiment of the present disclosure provides an electrostatic protection circuit including a discharge sub-circuit, a buffer sub-circuit, and an electrostatic protection line. When the static electricity generated on the signal line is large, the buffer sub-circuit may form a charge buffer channel between the signal line and the discharge sub-circuit, thereby preventing the static electricity from damaging the discharge sub-circuit, and ensuring the reliability of the discharge sub-circuit and the antistatic performance of the electrostatic protection circuit.

It should be noted that, when the electrostatic protection circuit includes one discharge sub-circuit 10 and one buffer sub-circuit 20, the structure of the electrostatic protection circuit is relatively simple. When the electrostatic protection circuit includes a plurality of discharge sub-circuits 10 or a plurality of buffer sub-circuits 20, if one of the discharge sub-circuits 10 fails, other discharge sub-circuits 10 can still discharge the static electricity on the signal line S. Similarly, if one of the buffer sub-circuits 20 fails, other buffer sub-circuits 20 can still protect the discharge sub-circuit 10. Therefore, the reliability of the electrostatic protection circuit can be effectively improved. In the embodiment of the present disclosure, the number of the discharge sub-circuits 10 and the buffer sub-circuits 20 in the electrostatic protection circuit may be flexibly selected according to application requirements, which is not limited in the embodiment of the present disclosure.

The gate-source voltage Vgs of the transistor satisfies: Vgs=Vg−Vs (that is, the difference value between the gate potential Vg and the source potential Vs). For a P-type transistor, when Vgs<Vth, the transistor is turned on, where Vth is the threshold voltage of the transistor. Since the Vth of the P-type transistor is generally less than or equal to zero, the P-type transistor may be turned on when the gate potential Vg is less than the first electrode potential Vs.

If respective transistors included in the electrostatic protection circuit are all P-type transistors, when high-voltage static electricity is generated on the signal line S, the gate potential of the second transistor M2 is less than the first electrode potential. In this case, the second transistor M2 is turned on, to conduct the signal line S with the electrostatic protection line L, and the signal line S can discharge electricity to the electrostatic protection line L through the second transistor M2. When low-voltage static electricity is generated on the signal line S, the gate potential of the first transistor M1 is less than the first electrode potential. In this case, the first transistor M1 is turned on, to conduct the signal line S with the electrostatic protection line L, and the signal line S can discharge electricity to the electrostatic protection line L through the first transistor M1.

Referring to FIG. 1, it can be seen that when high-voltage static electricity (i.e., static electricity generated by positive charges) is generated on the signal line S, the gate potential of the third transistor M3 is less than the first electrode potential. Therefore, the third transistor M3 is turned on, and a temporary buffer channel for the high-voltage static electricity is formed between the first and second electrodes of the third transistor M3. The temporary buffer channel can temporarily store electrostatic charges and avoid the impact of the high-voltage static electricity on the discharge sub-circuit 10. Finally, the high-voltage static electricity on the signal line S can be released to the electrostatic protection line L through the second transistor M2.

When low-voltage static electricity (i.e., static electricity generated by negative charges) is generated on the signal line S, the gate potential of the fourth transistor M4 is less than the first electrode potential. Therefore, the fourth transistor M4 is turned on, and a temporary buffer channel for the low-voltage static electricity is formed between the first and second electrodes of the fourth transistor M4. The temporary buffer channel can temporarily store electrostatic charges and avoid the impact of the low-voltage static electricity on the discharge sub-circuit 10. Finally, the low-voltage static electricity on the signal line S may be released to the electrostatic protection line L through the first transistor M1.

For an N-type transistor, when Vgs>Vth, the transistor is turned on. Since the Vth of the N-type transistor is generally greater than or equal to zero, the N-type transistor may be turned on when the gate potential Vg is greater than the first electrode potential Vs. If respective transistors in the electrostatic protection circuit are all N-type transistors, when high-voltage static electricity is generated on the signal line S, the first transistor M1 in the discharge sub-circuit 10 and the fourth transistor M4 in the buffer sub-circuit may be turned on. The fourth transistor M4 may buffer the high-voltage static electricity, and the high-voltage static electricity may be finally discharged to the electrostatic protection line L through the first transistor M1.

When low-voltage static electricity is generated on the signal line S, the second transistor M2 in the discharge sub-circuit 10 and the third transistor M3 in the buffer sub-circuit may be turned on. The third transistor M3 may buffer the low-voltage static electricity, and the low-voltage static electricity may be finally discharged to the electrostatic protection line L through the second transistor M2.

According to the above analysis, it may be known that, no matter whether the high-voltage static electricity or the low-voltage static electricity is generated on the signal line S, the transistors in an on-state of the discharge sub-circuit 10 may temporarily store electrostatic charges through the transistors in the buffer sub-circuit 20, to form a temporary buffer channel for the static electricity, thereby avoiding the impact of the static electricity on the discharge sub-circuit 10, and further improving the reliability of the electrostatic protection circuit.

Figure 2:
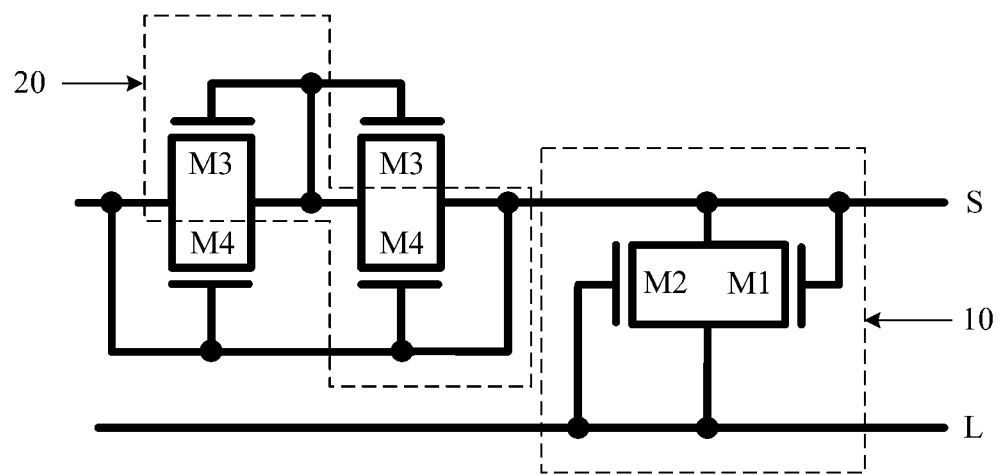
FIG. 2 is an equivalent circuit diagram of another electrostatic protection circuit provided in an embodiment of the present disclosure.

Optionally, as shown in FIG. 2, the electrostatic protection circuit may include two buffer sub-circuits 20 (only one buffer sub-circuit is marked in FIG. 2). When any of the buffer sub-circuits 20 fails, the other buffer sub-circuit 20 can still guarantee the protection of the discharge sub-circuit 10, which ensures the reliability of the electrostatic protection circuit.

As may be seen from FIG. 2, the third transistors M3 in the two buffer sub-circuits 20 may be connected in series, and the fourth transistors M4 in the two buffer sub-circuits 20 may be connected in series.

Figure 3:
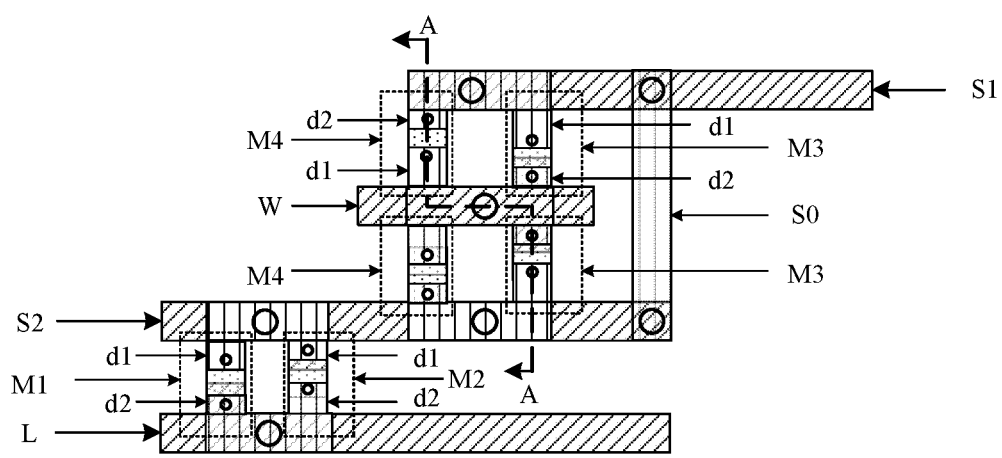
FIG. 3 is a schematic structural diagram of an electrostatic protection circuit provided in an embodiment of the present disclosure.

FIG. 3 is a schematic structural diagram of an electrostatic protection circuit provided in an embodiment of the present disclosure. As shown in FIG. 3, the electrostatic protection circuit may further include a metal wire W that is insulated from both the signal line S and the electrostatic protection line L. The gate g and the second electrode d2 of the third transistor M3, and the first electrode d1 of the fourth transistor M4 are connected to the metal wire W, respectively.

Optionally, referring to FIG. 3, the signal line S may include a first line segment S1 and a second line segment S2 that are parallel to each other, and a connection line segment S0 for connecting the first line segment S1 and the second line segment S2.

The first line segment S1 and the second line segment S2 are both parallel to the electrostatic protection line L, and the second line segment S2 is close to the electrostatic protection line L relative to the first line segment S1. The third transistor M3 and the fourth transistor M4 are both disposed between the first line segment S1 and the second line segment S2, and the first electrode d1 of the third transistor M3 is connected to one of the first line segment S1 and the second line segment S2, and the gate g and the second electrode d2 of the fourth transistor M4 are both connected to the other line segment.

Exemplarily, the structure shown in FIG. 3 includes two buffer sub-circuits 20. The first electrode d1 of the third transistor M3 in one of the two buffer sub-circuits 20 is connected to the first line segment S1, and the gate g and the second electrode d2 of the fourth transistor M4 are both connected to the second line segment S2. The first electrode d1 of the third transistor M3 in the other buffer sub-circuit 20 is connected to the second line segment S2, and the gate g and the second electrode d2 of the fourth transistor M4 are both connected to the first line segment S1.

As shown in FIG. 3, the first transistor M1 and the second transistor M2 may be both disposed between the second line segment S2 and the electrostatic protection line L, and the gate g and the second electrode d2 of the first transistor M1 and the first electrode d1 of the second transistor M2 are all connected to the second line segment S2.

By designing the signal line S as two parallel line segments, disposing the transistors included in the buffer sub-circuit 20 between the two line segments, and disposing the transistors included in the discharge sub-circuit 10 between the second line segment S2 and electrostatic protection line L, the wiring of the buffer sub-circuit 20 and the discharge sub-circuit 10 may be facilitated, thereby reducing the wiring cost and the space occupied by the electrostatic protection circuit.

Optionally, as shown in FIG. 3, the metal wire W may be disposed between the first line segment S1 and the second line segment S2, and parallel to the first line segment S1.

Exemplarily, as shown in FIG. 3, the electrostatic protection circuit may include two buffer sub-circuits 20, and the third transistors M3 in the two buffer sub-circuits may be respectively disposed on two sides of the metal wire W, and the gates g and the second electrodes d2 of the third transistors M3 in the two buffer sub-circuits are all connected to the metal wire W. The fourth transistors M4 in the two buffer sub-circuits are respectively disposed on two sides of the metal wire W, and the first electrodes d1 of the fourth transistors M4 in the two buffer sub-circuits are both connected to the metal wire W.

Optionally, the gate g of the third transistor M3 and the metal wire W may be of an integral structure. That is, the third transistor M3 and the metal wire W may be formed by a single patterning process, so that the manufacturing process of the buffer sub-circuit 20 may be simplified, and the manufacturing cost may be reduced.

In the embodiment of the present disclosure, the first line segment S1 and the second line segment S2 may be disposed in the same layer, and the first line segment S1 and the connection line segment S0 may be disposed in different layers. For example, referring to FIG. 3, the connection line segment S0 may be connected to the first line segment S0 and the second line segment S2 through vias, respectively. Accumulation of static electricity on the signal line S can be reduced by forming the signal line S with line segments in different layers.

Figure 4:
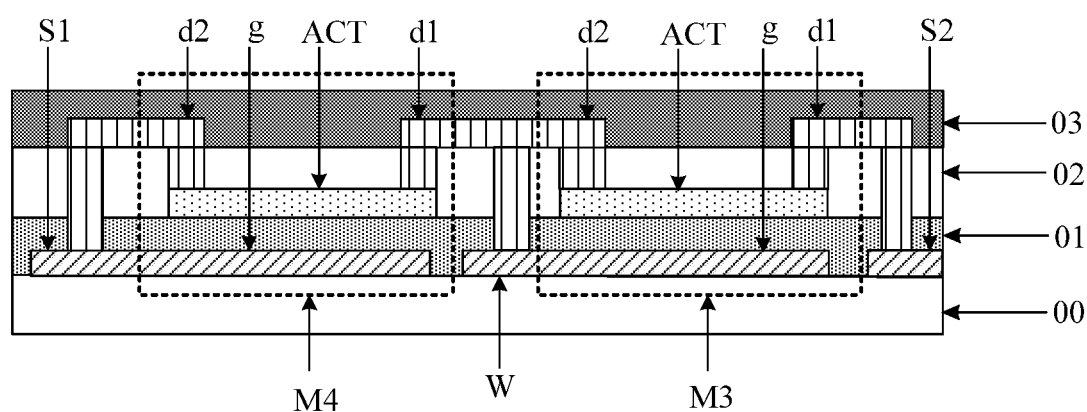
FIG. 4 is a cross-sectional view of FIG. 3 in the direction AA.

FIG. 4 is a cross-sectional view of FIG. 3 in the direction AA. As an alternative implementation, the signal line S may be a gate line. Referring to FIGS. 3 and 4, the first line segment S1 and the second line segment S2 are both disposed in the same layer as the gates g of the transistors, and the connection line segment S0 is disposed in the same layer as the first electrodes d1 and the second electrodes d2 of the transistors (not shown in the figure). Therefore, the second electrode d2 of the fourth transistor M4 may be connected to the first line segment S1 through a via, and the third transistor M3 may be connected to the second line segment S2 through a via.

Figure 5:
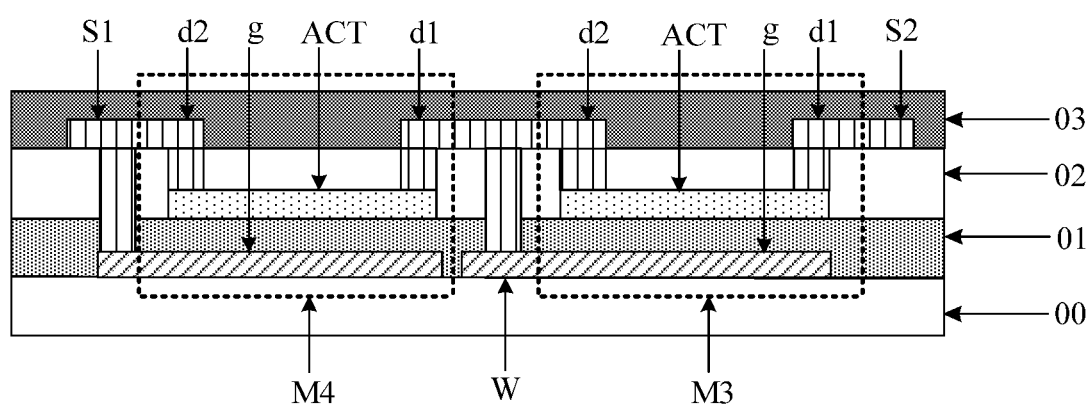
FIG. 5 is a cross-sectional view of a buffer sub-circuit provided in an embodiment of the present disclosure.

FIG. 5 is a cross-sectional view of a buffer sub-circuit provided in an embodiment of the present disclosure. As another alternative implementation, the signal line S may be a data line. Referring to FIG. 5, the first line segment S1 and the second line segment S2 are both disposed in the same layer as the first electrodes d1 and the second electrodes d2 of the transistors, and the connection line segment S0 is disposed in the same layer as the gates g of the transistors (not shown in the figure).

The electrostatic protection circuit provided in the embodiment of the present disclosure may be applied to an array substrate. It may be seen with reference to FIGS. 3 to 5 that the metal wire W in the electrostatic protection circuit is not directly connected to other signal lines S in the array substrate, and is not connected to the signal terminal, that is, the metal wire W does not receive any electrical signal input in the array substrate. That is, the metal wire W is in a suspending state in the array substrate. By arranging a metal wire W in a suspending state in the array substrate, the static electricity generated by the metal wire W in the manufacturing process can be prevented from affecting other signal lines S.

It may be seen with reference to FIGS. 4 and 5 that the second electrode d2 of the third transistor M3 and the first electrode d1 of the fourth transistor M4 may be of an integral structure. And the integral structure may be connected to the metal wire W through a via. By designing the integral structure as an electrode shared by two transistors, wiring space can be saved effectively, thereby reducing the space occupied by the electrostatic protection circuit 100, and simplifying its manufacturing process.

Optionally, the second electrode d2 of the first transistor M1 and the first electrode d1 of the second transistor M2 are of an integral structure, and the first electrode d1 of the first transistor M1 and the second electrode d2 of the second transistor M2 are of an integral structure. By designing the integral structure as an electrode shared by two transistors, wiring space can be saved effectively, thereby reducing the space occupied by the electrostatic protection circuit, and simplifying its manufacturing process.

It may also be seen with reference to FIGS. 3 and 4 that the electrostatic protection circuit may be disposed on the base substrate 00. A gate insulating (GI) layer 01 is provided on a side of the gate g of the transistor away from the base substrate 00, and an active layer ACT of the transistor may be provided on a side of the gate insulating layer 01 away from the base substrate 00. An etch stop layer (ESL) 02 is further provided on a side of the active layer ACT away from the base substrate 00, and the first electrode d1 and the second electrode d2 of the transistor may be disposed on a side of the etch stop layer 02 away from the base substrate 00. A passivation layer (PVX) 03 may be further provided on a side of the first electrode d1 and the second electrode d2 of the transistor away from the base substrate 00.

The etch stop layer 02 may be made of a silicon oxide (SiOx) material, the gate insulating layer 01 may be made of an oxide insulating material such as SiOx or aluminum oxide ($Al_2O_3$), and the passivation layer 03 may be made of an insulating material such as silicon nitride, silicon oxynitride, polyimide, or acrylic.

Optionally, the active layer ACT may be made of a polysilicon material. For example, it may be made of a low-temperature polysilicon material. Or, the active layer ACT may also be made of an oxide material. For example, it may be made of an oxide material such as indium gallium zinc oxide (IGZO) or zinc oxide (ZnO).

In summary, the embodiment of the present disclosure provides an electrostatic protection circuit. The electrostatic protection circuit includes: at least one discharge sub-circuit, at least one buffer sub-circuit, and an electrostatic protection line. Each discharge sub-circuit includes a first transistor and a second transistor; each buffer sub-circuit includes a third transistor and a fourth transistor. When the static electricity generated on the signal line is large, the buffer sub-circuit can form a charge buffer channel between the signal line and the discharge sub-circuit, thereby effectively reducing the probability of failure of the electrostatic protection circuit, ensuring the reliability of the discharge sub-circuit, and ensuring the antistatic performance of the electrostatic protection circuit.

Figure 6:
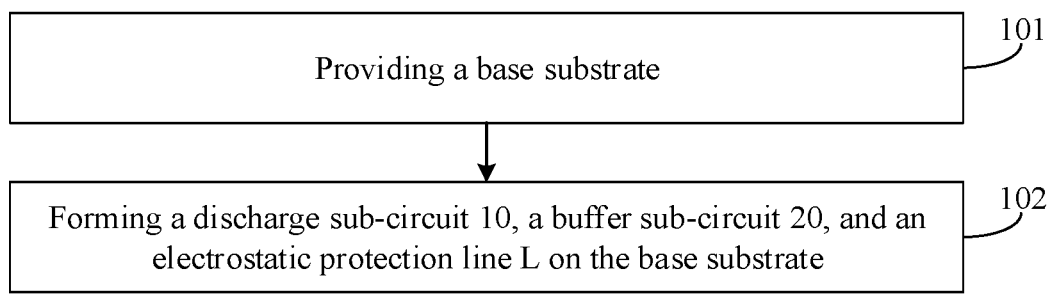
FIG. 6 is a flow chart of a method for manufacturing an electrostatic protection circuit provided in an embodiment of the present disclosure.

An embodiment of the present disclosure also provides a method for manufacturing an electrostatic protection circuit, which may be used for manufacturing the electrostatic protection circuit provided in the above embodiments. As shown in FIG. 6, the method may include the following steps.

In step 101, a base substrate is provided.

In step 102, a discharge sub-circuit 10, a buffer sub-circuit 20, and an electrostatic protection line L are formed on the base substrate. The discharge sub-circuit 10 includes a first transistor M1 and a second transistor M2; and the buffer sub-circuit 20 includes a third transistor M3 and a fourth transistor M4.

The gate g and the second electrode d2 of the first transistor M1 are both connected to the signal line S, and the first electrode d1 of the first transistor M1 is connected to the electrostatic protection line L. The gate g and the second electrode d2 of the second transistor M2 are both connected to the electrostatic protection line L, and the first electrode d1 of the second transistor M2 is connected to the signal line S. The gate g and the second electrode d2 of the third transistor M3 are both connected to the first electrode d1 of the fourth transistor M4, and the first electrode d1 of the third transistor M3 is connected to the signal line S. The gate g and the second electrode d2 of the fourth transistor M4 are both connected to the signal line S.

It should be noted that the electrostatic protection circuit provided in the embodiment of the present disclosure may be formed in a non-display area around the base substrate, and may be formed together with the signal lines S and the pixel units in the display area.

Optionally, in the above step 102, two buffer sub-circuits 20 may be formed on the base substrate while the discharge sub-circuit 10 is formed, and each buffer sub-circuit 20 includes a third transistor M3 and a fourth transistor M4.

Optionally, in the above step 102, a metal wire W insulating from both the signal line S and the electrostatic protection line L may be formed while the electrostatic protection line L is formed. The gate g and the second electrode d2 of the third transistor M3 and the first electrode d1 of the fourth transistor M4 in the buffer sub-circuit 20 are connected to the metal wire W.

Optionally, the signal line S may include a first line segment S1 and a second line segment S2 that are parallel to each other, and a connection line segment S0 for connecting the first line segment S1 and the second line segment S2.

The first line segment S1 and the second line segment S2 are parallel to the electrostatic protection line L, and the second line segment S2 is close to the electrostatic protection line L relative to the first line segment S1. The third transistor M3 and the fourth transistor M4 are both formed between the first line segment S1 and the second line segment S2, and the first electrode d1 of the third transistor M3 is connected to one of the first line segment S1 and the second line segment S2, and the gate g and the second electrode d2 of the fourth transistor M4 are both connected to the other line segment thereof. The first transistor M1 and the second transistor M2 are both formed between the second line segment S2 and the electrostatic protection line L, and the gate g and the second electrode d2 of the first transistor M1 and the first electrode d1 of the second transistor M2 are all connected to the second line segment S2.

Correspondingly, the metal wire W may be formed between the first line segment S1 and the second line segment S2, and parallel to the first line segment S1.

Optionally, the gate g of the third transistor M3 and the metal wire W may be of an integral structure formed by a single patterning process, to avoid increasing the complexity of the process of manufacturing the electrostatic protection circuit.

Optionally, the first line segment S1 and the second line segment S2 of the signal line S are formed on the same layer, and the first line segment S1 and the connection line segment S0 of the signal line S are formed on different layers. The connection line segment S0 may be connected to the first line segment S1 and the second line segment S2 through vias, respectively.

Optionally, if the signal line S is a gate line, the first line segment S1 and the second line segment S2 may be formed with the gates g of respective transistors in the electrostatic protection circuit by a single patterning process, and the connection line segment S0 may be formed with the first electrodes d1 and the second electrodes d2 of the respective transistors by a single patterning process.

Optionally, if the signal line S is a data line, the first line segment S1 and the second line segment S2 may be formed with the first electrodes d1 and the second electrodes d2 of respective transistors in the electrostatic protection circuit by a single patterning process, and the connection line segment S0 may be formed with the gates g of respective transistors by a single patterning process.

Optionally, the electrostatic protection circuit may be applied to an array substrate. The metal wire W in the electrostatic protection circuit is not directly connected to other signal lines S in the array substrate, and is not connected to the signal terminal, that is, the metal wire W does not receive any electrical signal input in the array substrate. That is, the metal wire W is in a suspending state in the array substrate.

Optionally, the second electrode d2 of the third transistor M3 and the first electrode d1 of the fourth transistor M4 may be of an integral structure formed by a single patterning process, and the gate g of the third transistor M3 may be connected with the integral structure through a via.

Optionally, the second electrode d2 of the first transistor M1 and the first electrode d1 of the second transistor M2 may be of an integral structure formed by a single patterning process, and the gate g of the first transistor M1 may be connected with the integral structure through a via. The first electrode d1 of the first transistor M1 and the second electrode d2 of the second transistor M2 may be of an integral structure formed by a single patterning process, and the gate g of the second transistor M2 may be connected with the integral structure through a via.

The single patterning process may include processes such as photoresist coating, exposure, development, etching, and photoresist stripping.

By taking the electrostatic protection circuit shown in FIGS. 1 and 4 as an example, and by taking an example in which the transistors in the electrostatic protection circuit are bottom gate structures, the method for manufacturing the electrostatic protection circuit provided in the embodiment of the present disclosure is introduced. The method may include the following steps.

In step S1a, a gate metal thin film is formed on a base substrate.

The base substrate may be a transparent glass substrate, and the gate metal thin film may be fabricated by a method such as magnetron sputtering or evaporation. The gate metal thin film may be a film layer formed by a low-resistance metal material, for example, a single-layer metal thin film formed by materials such as molybdenum (Mo), aluminum (Al), aluminum-nickel alloy, chromium (Cr), copper (Cu), titanium (Ti), or AlNd, or a multilayer metal film formed by Mo/Al/Mo or Ti/Al/Ti.

In step S2a, the gate metal thin film is patterned to form a gate pattern.

Optionally, the gate metal thin film may be patterned by a photoetching process using a first mask to form a gate pattern, and the gate pattern may include gates of respective transistors and the electrostatic protection line in the electrostatic protection circuit. Of course, since the electrostatic protection circuit may be formed in synchronization with the pixel units in the display area, the gate pattern may further include gate lines and gates of respective driving transistors. The photoetching process may include steps of photoresist coating, exposure, development, etching, photoresist stripping, and the like.

Figure 7:
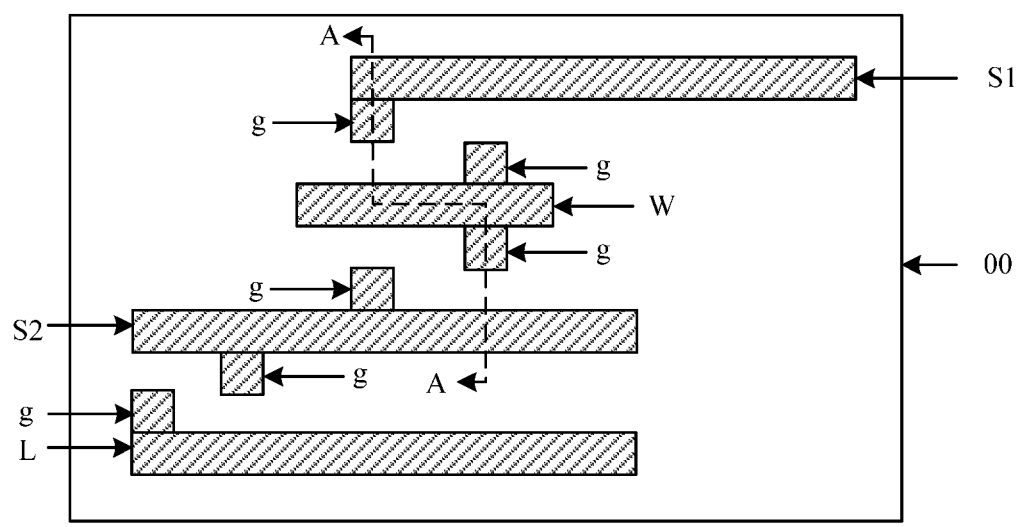
FIG. 7 is a top view of an electrostatic protection circuit after forming a gate pattern provided in an embodiment of the present disclosure.
Figure 8:
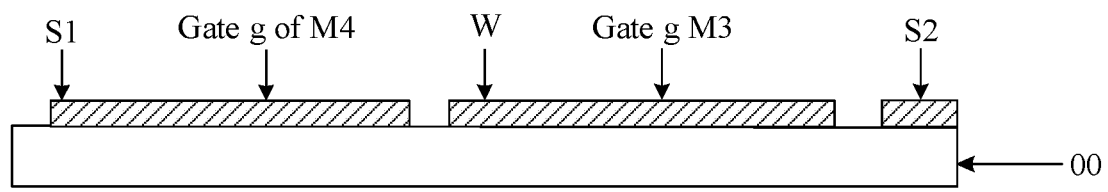
FIG. 8 is a cross-sectional view of FIG. 7 in the direction AA.

Illustratively, as shown in FIG. 7, the gate pattern formed in the non-display area of the base substrate 00 may include gates g of respective transistors, a metal wire W, and an electrostatic protection line L in the electrostatic protection circuit. Further, as can be seen with reference to FIG. 7, the gate pattern may further include a first line segment S1 and a second line segment S2 in the signal line S. FIG. 8 is a cross-sectional view of FIG. 7 in the direction AA. Referring to FIG. 8, it can be seen that the gate g of the fourth transistor M4 and the first line segment S1 are of an integral structure, and the gate of the third transistor M3 and the metal wire W are of an integral structure.

In step S3a, a gate insulating layer, an active layer, and an etch stop layer are sequentially formed on the base substrate on which the gate pattern is formed.

Figure 9:
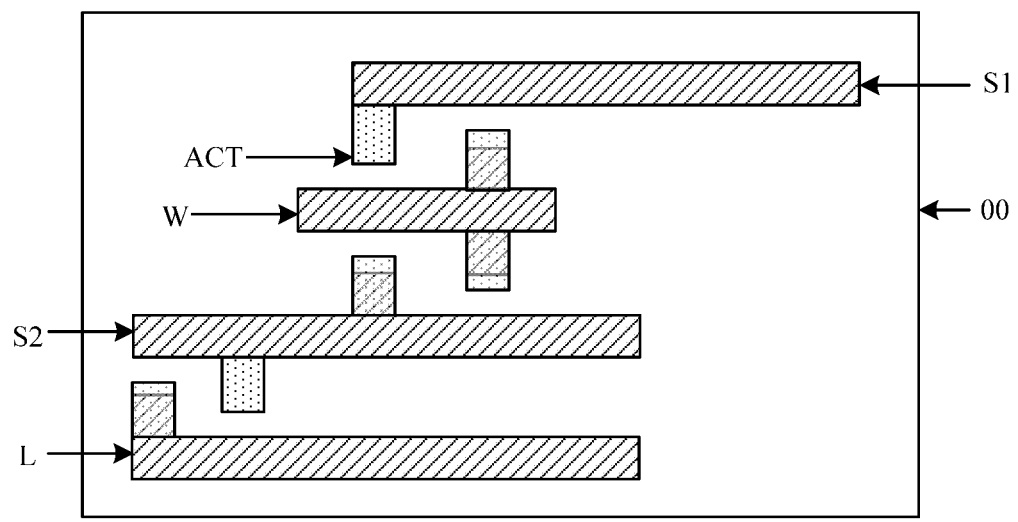
FIG. 9 is a top view of an electrostatic protection circuit after forming an active layer provided in an embodiment of the present disclosure.

The base substrate on which the gate insulating layer 01 and the active layer ACT are formed may be as shown in FIG. 9. The gate insulating layer may be formed of an oxide insulating material such as silicon oxide, silicon nitride, silicon oxynitride, or aluminum oxide. The active layer may be formed of an oxide semiconductor material. The etch stop layer may be made of a silicon oxide (SiOx) material.

Figure 10:
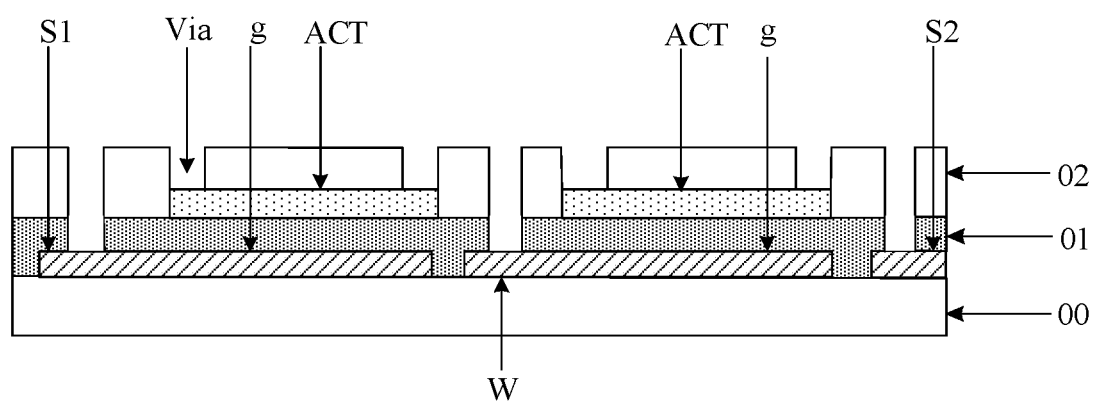
FIG. 10 is a schematic structural diagram of a gate insulation layer, an active layer, and an etch stop layer provided in an embodiment of the present disclosure.

FIG. 10 is a schematic structural diagram after the gate insulating layer, the active layer, and the etch stop layer are formed on the base substrate. It can also be seen with reference to FIG. 10 that after the etch stop layer 02 is formed, a plurality of vias may also be formed on the base substrate. Part of the plurality of vias may expose the active layer to connect the active layer and the source-drain metal pattern; part of the vias may expose the first line segment and the second line segment in the signal line to connect the signal line and the source-drain metal pattern, and to connect the first line segment and the connection line segment, and to connect the second line segment and the connection line segment; part of the vias may expose the metal wire to connect the metal wire and the source-drain metal pattern; and part of the vias may expose the electrostatic protection line to connect the electrostatic protection line and the source-drain metal pattern.

In step S4a, a source-drain metal thin film is formed on the base substrate on which the etch stop layer 02 is formed.

The source-drain metal thin film may be formed by using the same material and process as the gate metal thin film, which is not repeated here.

In step S5a, the source-drain metal thin film is patterned to form a source-drain metal pattern.

Optionally, the source-drain metal thin film may be patterned by a photoetching process using a second mask to obtain a source-drain metal pattern. The source-drain metal pattern may include the first and second electrodes of respective transistors as well as the connection line segment. The first electrodes and the second electrodes of respective transistors may be connected to the active layer through vias, respectively, and may be connected to at least one line segment of the signal line, the metal wire, and the electrostatic protection line through a via. The connection line segment may be connected to the first line segment and the second line segment through vias, respectively.

Figure 11:
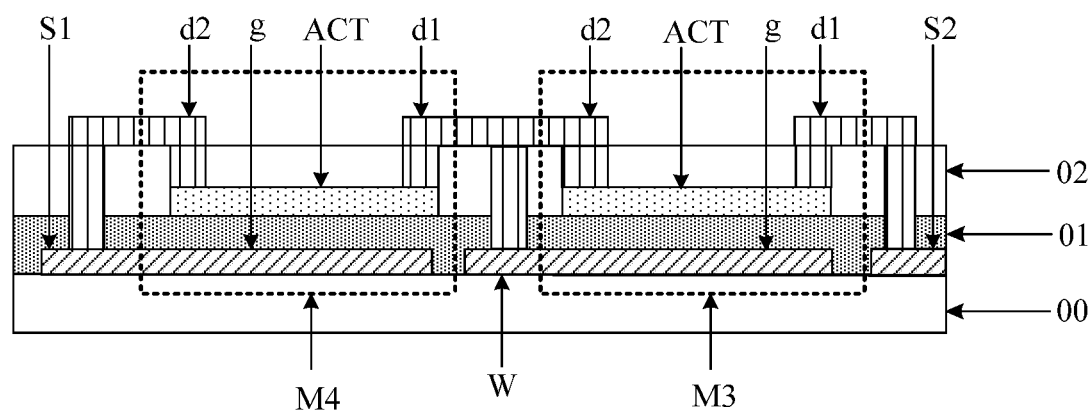
FIG. 11 is a schematic structural diagram of a source-drain metal pattern provided in an embodiment of the present disclosure.

Illustratively, as shown in FIG. 11, the source-drain metal pattern formed in the non-display area of the base substrate may include the first electrode d1 and second electrode d2 of the third transistor M3, and the first electrode d1 and second electrode d2 of the fourth transistor M4. The second electrode d2 of the third transistor M3 and the first electrode d1 of the fourth transistor M4 may be of an integral structure.

In step S6a, a passivation layer is formed on the base substrate on which the active-drain metal pattern is formed.

Optionally, an insulating material may be used to form a passivation protective film, and then a third mask may be used to define the pattern of the passivation protective film to form a passivation layer. Referring to FIG. 4, in the non-display area of the base substrate, the passivation layer 03 may completely cover the source-drain metal pattern, and in the display area of the base substrate, the passivation layer 03 may partially cover the source-drain metal pattern. That is, a via is formed in the passivation layer 03 for connecting the pixel electrode and the drain of a driving transistor.

Thereby, the manufacture of the electrostatic protection circuit can be completed. In the corrosion (i.e., etching) process of the above process, different corrosion methods, corrosion solutions and corrosion gases are required to ensure the control of the selection ratio, the slope angle (Profile), and the critical dimension (CD) of different materials. For example, in the process of forming the source-drain metal pattern, the gate insulating layer and the active layer may be removed using a similar method, i.e., plasma etching or reactive ion etching. By adjusting the etching gas and etching conditions, corrosion of multi thin films can be implemented in the same equipment. For example, by selecting a combination of different corrosion gases and different gas flows from gases such as sulfur hexafluoride, chlorine, oxygen and helium, corrosion of the above-mentioned different films can be implemented in the same equipment.

In order to achieve the optimization of the device structure and the high efficiency of the process, the corrosion conditions for different films, such as plasma power, air pressure, and electrode spacing, are different. The corrosion of a semiconductor thin film is generally performed in a plasma chamber with a lower air pressure and a higher power, to ensure a stronger ion bombardment and sputtering corrosion effect. Insulating films and metal films are generally performed in a plasma chamber with a higher air pressure and a lower power, to ensure a stronger chemical reactive ion corrosion effect. For example, sulfur hexafluoride at tens of volume flow rate (sccm) and chlorine gas at thousands of volume flow rate (sccm) are inputted into the equipment, and the semiconductor thin film may be efficiently etched and removed in an environment with a power above thousands of watts and an air pressure of tens of millitorr. For another example, sulfur hexafluoride at hundreds of volume flow rate (sccm) and chlorine gas at hundreds of volume flow rate (sccm) are inputted into the equipment, and the insulating thin film may be efficiently etched and removed in an environment with a power below thousands of watts and an air pressure of hundreds of millitorr.

For another example, in the process of forming the source-drain metal pattern, based on the source-drain metal material, the source-drain metal thin film may be removed by a chemical corrosion solution etching method, or a plasma etching method or a reactive ion etching method. For example, chlorine gas at hundreds to thousands of sccm and oxygen gas at thousands of sccm are inputted into the dry etching equipment, and the metal thin film may be efficiently etched and removed in an environment with a power below thousands of watts and an air pressure of hundreds of millitorr. When the gate pattern and the active layer are formed, the source-drain metal thin film and the doped semiconductor layer are continuously etched in the same equipment to be removed by using the plasma etching or reactive ion etching method, and the conditions described above. Wet etching may be used for removing metal thin films. Generally, a mixed solution of nitric acid, hydrochloric acid and acetic acid in a certain concentration ratio is used at a temperature of tens of degrees by the way of immersing and spraying.

By taking the electrostatic protection circuit shown in FIGS. 1 and 4 as an example, and by taking an example in which the transistors in the electrostatic protection circuit are top gate structures as an example, the method for manufacturing the electrostatic protection circuit provided in the embodiment of the present disclosure is introduced. The method may include the following steps.

In step S1b, a buffer layer is formed on a base substrate.

Illustratively, plasma enhanced chemical vapor deposition (PECVD) may be used to sequentially deposit a silicon nitride (SiN) thin film and a silicon dioxide (SiO2) thin film on the entire base substrate to obtain a buffer layer.

In step S2b, an active layer is formed on the base substrate on which the buffer layer is formed.

Optionally, an oxide semiconductor thin film may be deposited on the surface of the base substrate by processes such as sputtering, thermal evaporation, PECVD, Low Pressure Chemical Vapor Deposition (LPCVD), Atmospheric Pressure Chemical Vapor Deposition (APCVD), or Electron Cyclotron Resonance Chemical Vapor Deposition (ECR-CVD), and the oxide semiconductor thin film is patterned to obtain an active layer. For example, the oxide semiconductor thin film may be patterned by photoetching and etching processes. The etching process generally adopts wet etching, and the etching solution used may be sulfuric acid ($H_2SO_4$), phosphoric acid ($H_3PO_4$), or hydrogen peroxide ($H_2O_2$). Different etching solutions may be selected based on the oxide semiconductor material used by the active layer and the material of the source-drain metal thin film.

Further, the etch stop layer may be deposited on the surface of the active layer by using the PECVD, LPCVD, APCVD, ECR-CVD, or sputtering process. Since the oxide semiconductor material, such as IGZO, has a very fast corrosion rate in the traditional etching solution for etching a source-drain metal pattern, and meanwhile the oxide semiconductor is sensitive to water and oxygen, in order to protect the active layer, an etch stop layer needs to be added onto the active layer.

The material forming the oxide semiconductor thin film may be an amorphous or polycrystalline metal oxide semiconductor material, which may include one or more of metal elements, such as indium (In), gallium (Ga), zinc (Zn), hafnium (Hf), tin (Sn) and Al. Exemplarily, the oxide semiconductor material may be: ZnO, InZnO (referred to as IZO), ZnSnO (referred to as ZTO), InSnZnO (referred to as ITZO), GaZnO (referred to as GZO), InGaZnO (referred to as IGZO), HfInZnO (referred to as HIZO), SnInO (Referred to as ITO) or AlInZnO (referred to as AlZO). Or, the material forming the oxide semiconductor thin film may also be a material formed by doping the above metal oxide semiconductor material with one or more metal ions or non-metal ions, for example, it may be materials such as ZnO:Ga (that is, ZnO is doped with Ga ions), ZnO:Li, IGZO:Li, IGZO:N, ZnON.

Alternatively, the thickness of the oxide semiconductor thin film ranges from 40 nm to 50 nm, and the oxygen content during deposition is 15% to 30%.

In step S3b, a gate insulating layer is formed on the base substrate on which the active layer is formed.

Further, the photoresist on the polysilicon active layer may be removed by a photoresist stripping process, and a $SiO_2$ film or a composite film of $SiO_2$ and SiN is deposited using PECVD, to form a gate insulating layer on the active layer and the entire buffer layer.

In step S4b, a gate pattern is formed on the base substrate on which the gate insulating layer is formed.

In the embodiment of the present disclosure, one or more low-resistance material metal thin films may be deposited on the gate insulating layer by physical vapor deposition methods such as magnetron sputtering, and a gate pattern is formed by a photoetching process. The gate pattern may include the gates of respective transistors, the metal wire and the electrostatic protection line in the electrostatic protection circuit. Alternatively, the gate pattern may further include the first line segment and the second line segment of the signal line. The gate metal thin film may be a single-layer metal thin film formed of materials such as Al, Cu, Mo, Ti, or AlNd, or a multi-layer metal thin film formed of materials such as Mo/Al/Mo or Ti/Al/Ti.

In step S4b, an interlayer insulating layer is formed on the base substrate on which the gate pattern is formed.

Further, an interlayer insulating layer may be formed on the entire surface of the base substrate on which the gate pattern is formed by sequentially depositing an $SiO_2$ thin film and a SiN thin film using PECVD, and the interlayer insulating layer is etched by a mask and an etching process to form a first contact hole and a second contact hole.

In step S5b, a source-drain metal pattern is formed on the base substrate on which the interlayer insulating layer is formed.

A magnetron sputtering process may be used to deposit a source-drain metal thin film including one or more low-resistance materials on the interlayer insulating layer, and a source-drain metal pattern may be formed through a mask and etching process. The source-drain metal pattern may include the first and second electrodes of various transistors and the connection line segment. The connection line segment may be connected to the first line segment and the second line segment through vias respectively, the first electrode may be in contact with the active layer through the first contact hole, and the second electrode may be in contact with the active layer through the second contact hole.

The material forming the source-drain metal thin film may include any one of molybdenum, molybdenum-niobium alloy, aluminum, aluminum-neodymium alloy, titanium, and copper. The source-drain metal thin film may have a thickness ranging from 20 to 30 nm. It should be noted here that the source-drain metal thin film may be a single-layer metal film layer, a double-layer metal film layer of buffer metal/metal, or a three-layer metal film layer of buffer metal/metal/buffer metal.

Further, the substrate after the above steps may be annealed at an annealing temperature of 30 to 320° C. for 30 minutes. In this step, metal atoms in the metal materials of the first electrodes and the second electrodes of the transistors may diffuse to the active layer, to chemically react with oxygen atoms in the oxide semiconductor material forming the active layer, so that the active layer material at this location loses oxygen, that is, the number of oxygen vacancies increases. At the same time, free electrons also increase accordingly. Thus, the semiconductor material at the location where the chemical reaction happens presents a metallization (semiconductor) trend. Hence, the ohmic contact between the first electrodes and the second electrodes of the transistors and the active layer may be increased. Meanwhile, the stability of the channel region of the active layer can be enhanced, so that the performance of the oxide transistor is better.

In step S6b, a passivation layer is formed on the base substrate on which the source-drain metal pattern is formed.

Finally, a layer of SiN thin film may be deposited, by PECVD, on the entire surface of the base substrate on which the source-drain metal pattern is formed, and a passivation layer including vias may be formed by a mask and through an etching process. Afterwards, a hydrogenation process is performed by rapid thermal annealing or annealing through a thermal treatment furnace, to repair defects inside and on the interface of the polysilicon active layer. The via may be a via located in the display area of the base substrate for connecting the second electrode of the driving transistor and the pixel electrode.

Figure 12:
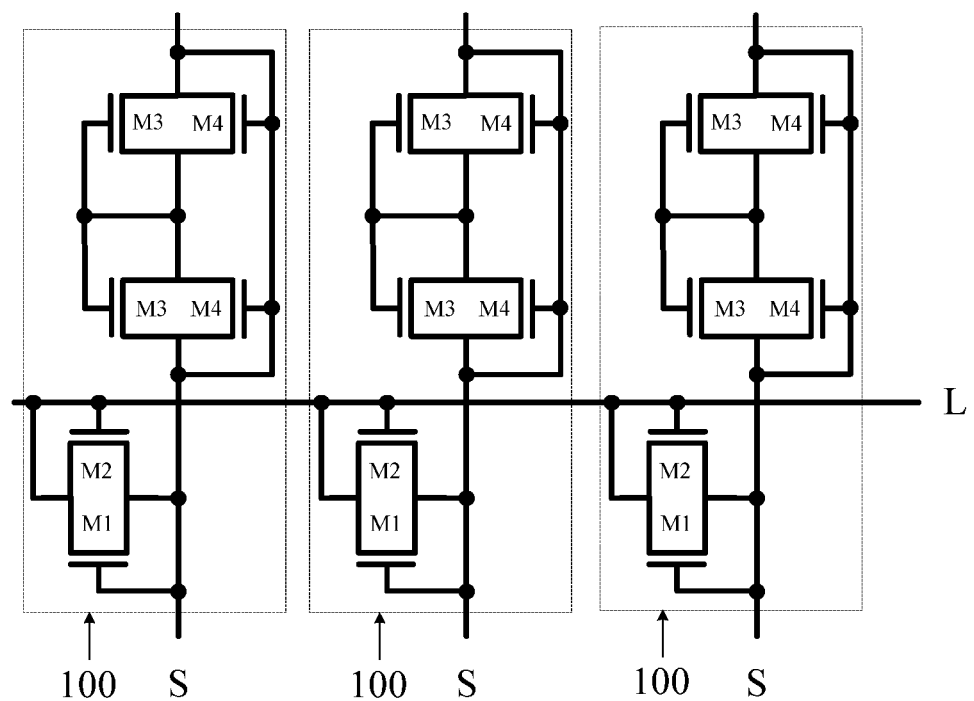
FIG. 12 is a schematic structural diagram of an array substrate provided in an embodiment of the present disclosure.

FIG. 12 is a schematic structural diagram of an array substrate provided in an embodiment of the present disclosure. Referring to FIG. 12, the array substrate may include a signal line S and an electrostatic protection circuit 100 connected to the signal line S. The electrostatic protection circuit 100 may be the circuit as shown in any one of FIGS. 1 to 5.

As shown in FIG. 12, the array substrate may include a plurality of signal lines S, and each signal line S is connected with one electrostatic protection circuit 100.

Optionally, referring to FIG. 3, each signal line S may include a first line segment S1 and a second line segment S2, and each signal line S is connected with one electrostatic protection circuit 100. Each electrostatic protection circuit 100 may include one discharge sub-circuit 10 and two buffer sub-circuits 20. Each discharge sub-circuit 10 may include one first transistor M1 and one second transistor M2, and each buffer sub-circuit 20 may include one third transistor M3 and one fourth transistor M4. In addition, the electrostatic protection circuits 100 connected to respective signal lines S may be all located in a non-display area around the array substrate.

Optionally, the signal line S may include a first line segment S1 and a second line segment S2 that are parallel to each other, and a connection line segment S0 for connecting the first line segment S1 and the second line segment S2. The first line segment S1 and the second line segment S2 are both parallel to the electrostatic protection line L in the electrostatic protection circuit 100, and the second line segment S2 is close to the electrostatic protection line L relative to the first line segment S1.

The third transistor M3 and the fourth transistor M4 in the electrostatic protection circuit 100 are both disposed between the first line segment S1 and the second line segment S2. In addition, the first electrode of the third transistor M3 is connected to one of the first line segment S1 and the second line segment S2, and the gate and the second electrode of the fourth transistor M4 are both connected to the other line segment of the first line segment S1 and the second line segment S2. The first transistor M1 and the second transistor M2 are both disposed between the second line segment S2 and the electrostatic protection line L, and the gate and the second electrode of the first transistor M1 and the first electrode of the second transistor M2 are all connected to the second line segment S2.

In the embodiment of the present disclosure, the electrostatic protection circuits 100 connected to respective signal lines S may be all disposed in the non-display area around the array substrate.

An embodiment of the present disclosure further provides a display apparatus. The display apparatus may include the array substrate as shown in FIG. 12. The display apparatus may be any product or component having a display function, such as a liquid crystal panel, a piece of electronic paper, an OLED panel, an AMOLED panel, a mobile phone, a tablet computer, a television, a display, a notebook computer, a digital photo frame, and a navigator.

The foregoing descriptions are merely exemplary embodiments of the present disclosure, and are not intended to limit the present disclosure. Within the spirit and principles of the disclosure, any modifications, equivalent substitutions, improvements, etc., are within the protection scope of the present disclosure.

What is claimed is:

1. An electrostatic protection circuit, comprising: at least one discharge sub-circuit, at least one buffer sub-circuit and an electrostatic protection line; the electrostatic protection line being a common electrode line; each of the at least one discharge sub-circuit comprising a first transistor and a second transistor, and each of the at least one buffer sub-circuit comprising a third transistor and a fourth transistor, wherein
a gate and a second electrode of the first transistor are connected to a signal line, and a first electrode of the first transistor is connected to the electrostatic protection line;
a gate and a second electrode of the second transistor are connected to the electrostatic protection line, and a first electrode of the second transistor is connected to the signal line;
a gate and a second electrode of the third transistor are connected to a first electrode of the fourth transistor, and a first electrode of the third transistor is connected to the signal line;
a gate and a second electrode of the fourth transistor are connected to the signal line;
the signal line comprises: a first line segment and a second line segment that are parallel to each other, and a connection line segment for connecting the first line segment and the second line segment; and
the third transistor and the fourth transistor are both disposed between the first line segment and the second line segment, and the first electrode of the third transistor is connected to one of the first line segment and the second line segment, and the gate and the second electrode of the fourth transistor are both connected to the other of the first line segment and the second line segment.

2. The electrostatic protection circuit according to claim 1, comprising: two buffer sub-circuits.

3. The electrostatic protection circuit according to claim 1, wherein the first line segment and the second line segment are both parallel to the electrostatic protection line, and the second line segment is close to the electrostatic protection line relative to the first line segment;
the first transistor and the second transistor are both disposed between the second line segment and the electrostatic protection line, and the gate and the second electrode of the first transistor and the first electrode of the second transistor are all connected to the second line segment.

4. The electrostatic protection circuit according to claim 3, comprising: two buffer sub-circuits; the signal line is a gate line, and the first line segment and the second line segment are both disposed in the same layer as the gates of the transistors, the connection line segment is disposed in the same layer as the first electrodes and the second electrodes of the transistors; and the connection line segment is connected to the first line segment and the second line segment through vias, respectively;
the electrostatic protection circuit further comprises: a metal wire insulated from both the signal line and the electrostatic protection line; the metal wire being disposed between the first line segment and the second line segment of the signal line, and the metal wire being parallel to the first line segment; the electrostatic protection circuit is applied in an array substrate, the metal wire is not connected to other signal lines in the array substrate, and is not connected to a signal terminal;
the gate and the second electrode of the third transistor, and the first electrode of the fourth transistor are connected to the metal line, the gate of the third transistor and the metal line are of an integral structure, and the second electrode of the third transistor and the first electrode of the fourth transistor are of an integral structure; the second electrode of the first transistor and the first electrode of the second transistor are of an integral structure, and the first electrode of the first transistor and the second electrode of the second transistor are of an integral structure.

5. The electrostatic protection circuit according to claim 3, comprising: two buffer sub-circuits; the signal line is a data line, and the first line segment and the second line segment are both disposed in the same layer as the first electrodes and the second electrodes of the transistors, the connection line segment is disposed in the same layer as the gates of the transistors; and the connection line segment is connected to the first line segment and the second line segment through vias, respectively;
the electrostatic protection circuit further comprises: a metal wire insulated from both the data line and the electrostatic protection line; the metal wire being disposed between the first line segment and the second line segment of the signal line, and the metal wire being parallel to the first line segment; the electrostatic protection circuit is applied in an array substrate, the metal wire is not connected to other signal lines in the array substrate, and is not connected to a signal terminal;
the gate and the second electrode of the third transistor, and the first electrode of the fourth transistor are connected to the metal line, the gate of the third transistor and the metal line are of an integral structure, and the second electrode of the third transistor and the first electrode of the fourth transistor are of an integral structure; the second electrode of the first transistor and the first electrode of the second transistor are of an integral structure, and the first electrode of the first transistor and the second electrode of the second transistor are of an integral structure.

6. The electrostatic protection circuit according to claim 1, wherein
the first line segment and the second line segment are disposed in the same layer, and the first line segment and the connection line segment are disposed in different layers;
the connection line segment is connected to the first line segment and the second line segment through vias, respectively.

7. The electrostatic protection circuit according to claim 6, wherein
the signal line is a gate line, and the first line segment and the second line segment are both disposed in the same layer as the gates of the transistors, and the connection line segment is disposed in the same layer as the first electrodes and the second electrodes of the transistors.

8. The electrostatic protection circuit according to claim 6, wherein
the signal line is a data line, and the first line segment and the second line segment are both disposed in the same layer as the first electrodes and the second electrodes of the transistors, and the connection line segment is disposed in the same layer as the gates of the transistors.

9. The electrostatic protection circuit according to claim 1, further comprising: a metal wire insulated from both the signal line and the electrostatic protection line;
wherein the gate and the second electrode of the third transistor, and the first electrode of the fourth transistor are connected to the metal wire.

10. The electrostatic protection circuit according to claim 9, wherein
the metal wire is disposed between the first line segment and the second line segment of the signal line, and the metal wire is parallel to the first line segment.

11. The electrostatic protection circuit according to claim 9, wherein the gate of the third transistor and the metal wire are of an integral structure.

12. The electrostatic protection circuit according to claim 9, wherein the electrostatic protection circuit is applied in an array substrate;
the metal wire is not connected to other signal lines in the array substrate, and is not connected to a signal terminal.

13. The electrostatic protection circuit according to claim 1, wherein the second electrode of the third transistor and the first electrode of the fourth transistor are of an integral structure.

14. The electrostatic protection circuit according to claim 1, wherein
the second electrode of the first transistor and the first electrode of the second transistor are of an integral structure, and the first electrode of the first transistor and the second electrode of the second transistor are of an integral structure.

15. An array substrate, comprising:
a signal line, and an electrostatic protection circuit connected to the signal line; wherein the electrostatic protection circuit comprises: at least one discharge sub-circuit, at least one buffer sub-circuit and an electrostatic protection line; the electrostatic protection line being a common electrode line; each of the at least one discharge sub-circuit comprising a first transistor and a second transistor, and each of the at least one buffer sub-circuit comprising a third transistor and a fourth transistor, wherein
a gate and a second electrode of the first transistor are connected to the signal line, and a first electrode of the first transistor is connected to the electrostatic protection line;
a gate and a second electrode of the second transistor are connected to the electrostatic protection line, and a first electrode of the second transistor is connected to the signal line;
a gate and a second electrode of the third transistor are connected to a first electrode of the fourth transistor, and a first electrode of the third transistor is connected to the signal line;
a gate and a second electrode of the fourth transistor are connected to the signal line;
the signal line comprises: a first line segment and a second line segment that are parallel to each other, and a connection line segment for connecting the first line segment and the second line segment; and
the third transistor and the fourth transistor are both disposed between the first line segment and the second line segment, and the first electrode of the third transistor is connected to one of the first line segment and the second line segment, and the gate and the second electrode of the fourth transistor are both connected to the other of the first line segment and the second line segment.

16. The array substrate according to claim 15, wherein the first line segment and the second line segment are both parallel to the electrostatic protection line in the electrostatic protection circuit, and the second line segment is close to the electrostatic protection line relative to the first line segment;
the first transistor and the second transistor in the electrostatic protection circuit are both disposed between the second line segment and the electrostatic protection line, and the gate and the second electrode of the first transistor, and the first electrode of the second transistor are all connected to the second line segment.

17. A display apparatus, comprising: the array substrate according to claim 15.

18. A method for manufacturing an electrostatic protection circuit, comprising:
providing a base substrate; and
forming at least one discharge sub-circuit, at least one buffer sub-circuit and an electrostatic protection line on the base substrate, wherein
the electrostatic protection line is a common electrode line, each of the at least one discharge sub-circuit comprises a first transistor and a second transistor, and each of the at least one buffer sub-circuit comprises a third transistor and a fourth transistor;
a gate and a second electrode of the first transistor are connected to the signal line, and a first electrode of the first transistor is connected to the electrostatic protection line;
a gate and a second electrode of the second transistor are connected to the electrostatic protection line, and a first electrode of the second transistor is connected to the signal line;
a gate and a second electrode of the third transistor are connected to a first electrode of the fourth transistor, and a first electrode of the third transistor is connected to the signal line;
a gate and a second electrode of the fourth transistor are connected to the signal line;
the signal line comprises: a first line segment and a second line segment that are parallel to each other, and a connection line segment for connecting the first line segment and the second line segment; and
the third transistor and the fourth transistor are both disposed between the first line segment and the second line segment, and the first electrode of the third transistor is connected to one of the first line segment and the second line segment, and the gate and the second electrode of the fourth transistor are both connected to the other of the first line segment and the second line segment.

\* \* \* \* \*